US012615049B2

(12) United States Patent
Bong et al.

(10) Patent No.: US 12,615,049 B2
(45) Date of Patent: *\*Apr. 28, 2026**

(54) FIELD PROGRAMMABLE GATE ARRAY SYSTEM

(71) Applicant: REBELLIONS INC., Seongnam-si (KR)

(72) Inventors: Kyeongryeol Bong, Seongnam-si (KR); Juyeong Yoon, Seongnam-si (KR)

(73) Assignee: REBELLIONS INC., Seongnam-si (KR)

( * ) Notice: Subject to any disclaimer, the term of this patent is extended or adjusted under 35 U.S.C. 154(b) by 128 days.

This patent is subject to a terminal disclaimer.

(21) Appl. No.: 18/635,489

(22) Filed: Apr. 15, 2024

(65) Prior Publication Data

US 2025/0141453 A1 May 1, 2025

Related U.S. Application Data

(63) Continuation of application No. 18/391,407, filed on Dec. 20, 2023, now Pat. No. 11,990,904.

(30) Foreign Application Priority Data

Oct. 26, 2023 (KR) ........................ 10-2023-0145104

(51) Int. Cl.
*H03K 19/17736* (2020.01)

(52) U.S. Cl.
CPC ................................ *H03K 19/1774* (2013.01)

(58) Field of Classification Search
None
See application file for complete search history.

(56) References Cited

U.S. PATENT DOCUMENTS

| | | | | |
|---|---|---|---|---|
| 8,595,683 B1 * | 11/2013 | de Buren | ................ | G06F 30/34 |
| | | | | 326/38 |
| 9,148,152 B1 * | 9/2015 | Joung | ................ | H03K 19/1776 |
| 9,959,375 B2 * | 5/2018 | Larzul | ................... | G06F 30/367 |
| 10,763,865 B1 * | 9/2020 | Badizadegan | .......... | H03L 7/089 |
| 2022/0382944 A1 * | 12/2022 | Yin | ........................ | G06F 13/126 |

* cited by examiner

*Primary Examiner* — Jany Richardson
(74) *Attorney, Agent, or Firm* — BROADVIEW IP LAW, PC

(57) ABSTRACT

A Field Programmable Gate Array (FPGA) system includes a main FPGA and one or more sub-FPGAs connected to the main FPGA. The main FPGA is configured to detect a positive edge of a pulse included in a user clock using a sampling clock of the main FPGA, generate a flag using the detected positive edge, generate a clock packet indicating the generated flag, and provide the generated clock packet to any one of the one or more sub-FPGAs.

20 Claims, 8 Drawing Sheets

FIELD PROGRAMMABLE GATE ARRAY SYSTEM

CROSS-REFERENCE TO RELATED APPLICATION

This application is a continuation of U.S. patent application Ser. No. 18/391,407, filed on Dec. 20, 2023, which claims priority under 35 U.S.C. § 119 to Korean Patent Application No. 10-2023-0145104, filed in the Korean Intellectual Property Office on Oct. 26, 2023, the entire contents of which are hereby incorporated by reference.

TECHNICAL FIELD

The present disclosure relates to an FPGA system including a plurality of Field Programmable Gate Arrays (FPGAs), and specifically, to an FPGA system that ensures, with a plurality of FPGAs, the same functionality as the functionality of processing data or signals with one FPGA, by providing a clock packet generated based on a user clock of a main FPGA to one of sub-FPGAs.

BACKGROUND

When testing the operation of new hardware, firmware, and/or software, etc., various types of chips may be designed and used. In particular, since chip design changes are frequently performed according to test results during operation tests, the Field Programmable Gate Arrays (FPGAs), which allow the design changes to be applied repeatedly, have been used instead of the Application Specific Integrated Circuits (ASICs) which cannot be modified.

However, the capacity of FPGAs to implement the chip designs required for the operation tests is somewhat limited. Accordingly, if the chip design or logic scale exceeds a certain size, it is not possible even for the FPGA with the largest capacity among the commercially available FPGAs to implement all of the chip designs or logics in one FPGA.

In this regard, there are various ways to connect multiple chips or circuits, for example, a plurality of FPGAs. However, when a line-by-line connection method such as general-purpose input/output (GPIO) is used, it is difficult to implement a large number of lines for data communication between a plurality of FPGAs, and data communication between FPGAs may also be difficult as bottlenecks occur. In addition, although the FPGAs can be connected using a method such as Chip to Chip (C2C) or Die to Die (D2D) method, since handshaking process is typically implemented in the two-way communication, if it is not ensured that signals are sent and received within the same clock, it can be the changes in the chip design itself. In this case, additional logic and associated design should be added, and it may be difficult or impossible to ensure the same functionality for a plurality of FPGAs.

SUMMARY

In order to solve one or more problems (e.g., the problems described above and/or other problems not explicitly described herein), the present disclosure provides an FPGA system (apparatus) and a method for processing data in a plurality of FPGAs.

The present disclosure may be implemented in various ways, including a system (apparatus), a method, a computer-readable storage medium, and/or a computer program stored in a computer-readable storage medium.

The FPGA system may include a main FPGA and one or more sub-FPGAs connected to the main FPGA, and the main FPGA may be configured to detect a positive edge of a pulse included in a user clock using a sampling clock of the main FPGA, generate a flag using the detected positive edge, generate a clock packet indicating the generated flag, and provide the generated clock packet to any one of the one or more sub-FPGAs.

In addition, the main FPGA may include a communication unit including a transmitter and a receiver, and the main FPGA may be further configured to transmit the generated clock packet through the transmitter of the communication unit and receive the generated clock packet through the receiver of the communication unit.

In addition, the main FPGA may be further configured to generate a gated user clock for the main FPGA based on the received clock packet, generate a plurality of data items using the gated user clock, and generate a data packet including the generated plurality of data items using a sampling clock of the main FPGA.

In addition, the main FPGA may further include a user design logic and a packetization unit, the generating the plurality of data items using the gated user clock may include receiving, by the user design logic, the gated user clock, and generating, by the user design logic, a plurality of data items using the gated user clock, and the generating the data packet including the plurality of data items may include receiving, by the packetization unit, the generated plurality of data items, and generating, by the packetization unit, one or more data packets including the plurality of data items.

In addition, the communication unit may be configured to operate according to a serial communication protocol, the main FPGA may be further configured to provide the generated one or more data packets to any one of the one or more sub-FPGAs through the transmitter of the communication unit, and a number of one or more data packets may be determined based on a size of the plurality of data items and a size of data included in one data packet.

A frequency of the user clock may be predetermined based on a frequency of the sampling clock of the main FPGA, the number of the one or more data packets, and a data transfer time between any two FPGAs of the main FPGA and the one or more sub-FPGAs.

In addition, the cycle of the user clock may be equal to or greater than the resultant number obtained by adding the product of multiplying the cycle of the sampling clock of the main FPGA by the resultant number obtained by adding a number of clock packets and the number of the one or more data packets, and the transmission time and reception time between any two FPGAs of the main FPGA and the one or more sub-FPGAs.

In addition, each of the clock packet and the data packet may be formed in a format that includes a bit representing an operation mode, a set of bits representing a packet number, and a set of bits representing at least some of a plurality of data items.

In addition, the clock packet may have the set of bits representing the packet number and the set of bits representing at least some of the plurality of data items, which are empty or set to 0.

In addition, the clock packet may be a packet that includes, as a bit representing the operation mode, a bit representing the generated flag, and if the clock packet is provided to any one of the one or more sub-FPGAs, a gated user clock is generated for any one of the one or more sub-FPGAs provided with the clock packet, using a sampling clock of any one of the one or more sub-FPGAs provided with the clock packet.

According to another example of the present disclosure, a method for processing data in a plurality of FPGAs including a main FPGA and one or more sub-FPGAs may include detecting, by the main FPGA, a positive edge of a pulse included in a user clock using a sampling clock of the main FPGA, generating, by the main FPGA, a flag using the detected positive edge, generating, by the main FPGA, a clock packet representing the generated flag, and providing, by the main FPGA, the generated clock packet to any one of the one or more sub-FPGAs.

According to some examples of the present disclosure, using a plurality of FPGAs, it is possible to ensure the same functionality as that provided when using a single FPGA, even when the plurality of FPGAs are configured not to use synchronized clocks or same clock domain.

According to some examples of the present disclosure, since each of the plurality of FPGAs uses a gated user clock generated in response to the clock packet of the main FPGA, a synchronized clock can be used by each of the plurality of FPGAs. Under this configuration, each of the plurality of FPGAs including the main FPGA can process data or signals within one cycle of the user clock provided by the main FPGA.

According to some examples of the present disclosure, an FPGA system including a plurality of FPGAs capable of processing non-axi and/or massive signals can be implemented even when using commercial IP, such as IP provided by an FPGA tool.

According to some examples of the present disclosure, the sub-FPGA processes the data based on the clock packets received from the main FPGA, and the main FPGA processes the data based on the clock packets provided through loopback, so that the clocks used in each FPGA are the same as each other or take substantially the same packetization time and transfer delay time, thereby minimizing or eliminating the delay between the time of start of data processing in the main FPGA and the time of start of data processing in the sub-FPGA.

According to some examples of the present disclosure, an FPGA system can be implemented without separately implementing the architecture of the main FPGA and sub-FPGA.

The effects of the present disclosure are not limited to the effects described above, and other effects not described herein can be clearly understood by those of ordinary skill in the art (referred to as "ordinary technician") from the description of the claims.

BRIEF DESCRIPTION OF THE DRAWINGS

The above and other objects, features and advantages of the present disclosure will be described with reference to the accompanying drawings described below, where similar reference numerals indicate similar elements, but not limited thereto, in which.

4

Figure 8:
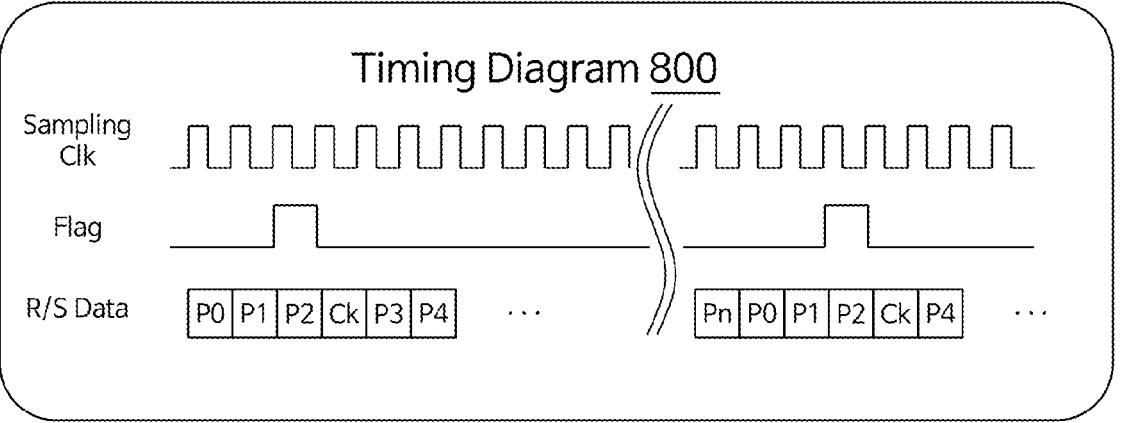
Figure 9:
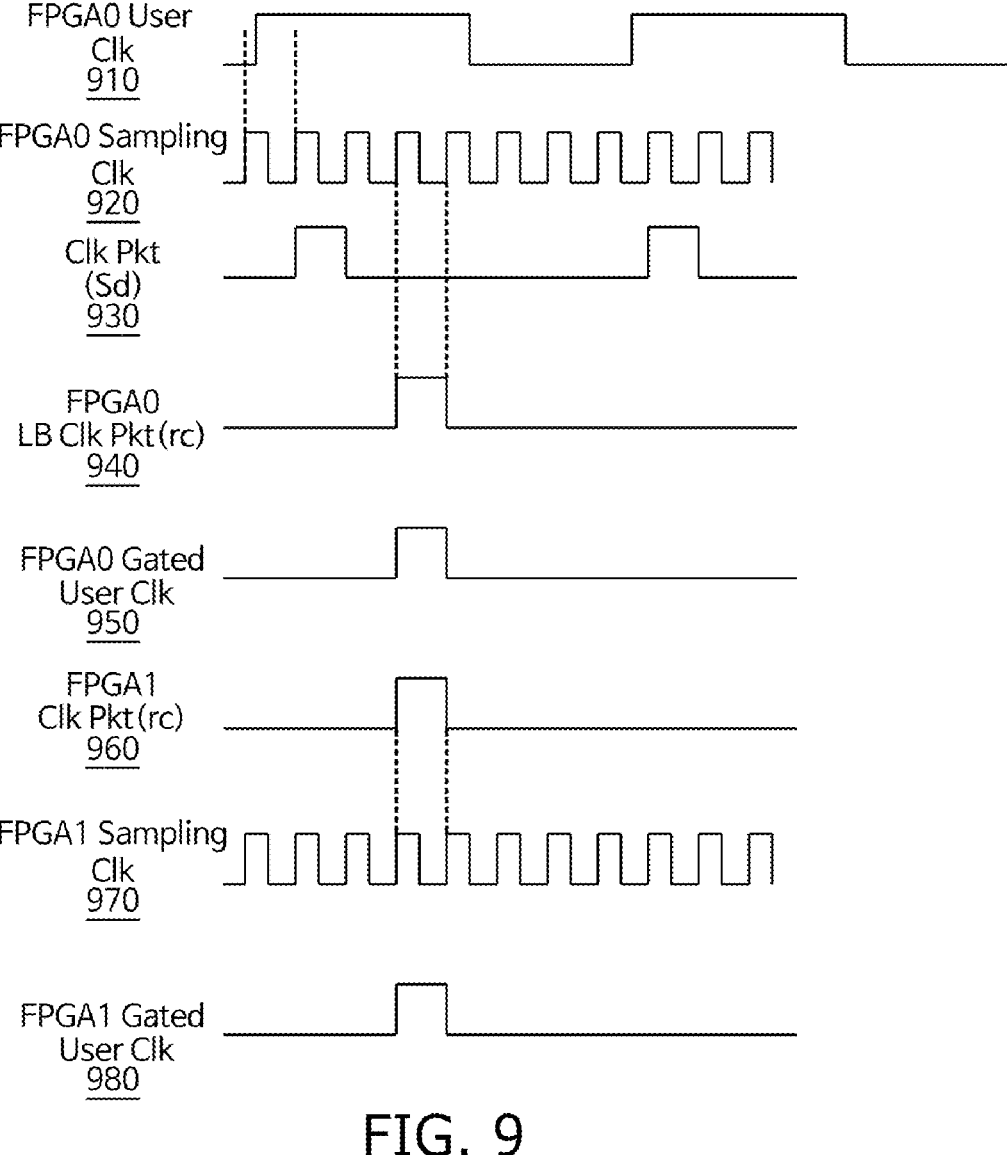
Figure 10:
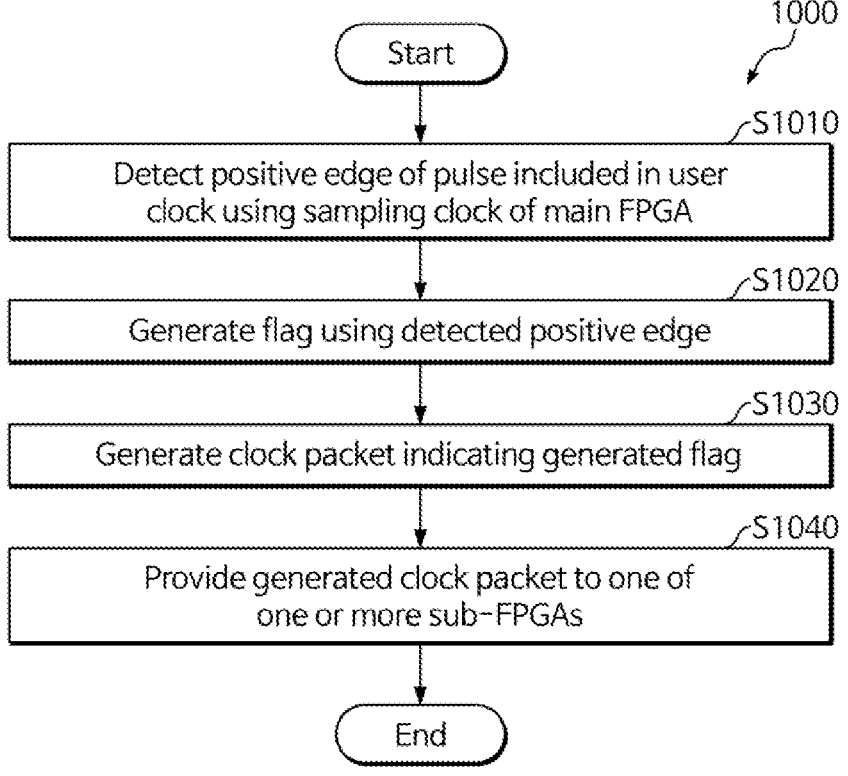

FIG. 8 illustrates an example of a timing diagram in which sent and received packets are transferred;

FIG. 9 illustrates pulses of clock signals associated with the main FPGA and sub-FPGAs; and FIG. 10 is a flowchart illustrating a method for generating a synchronized clock in a plurality of FPGAs including the main FPGA and one or more sub-FPGAs.

DETAILED DESCRIPTION

Hereinafter, example details for the practice of the present disclosure will be described in detail with reference to the accompanying drawings. However, in the following description, detailed descriptions of well-known functions or configurations will be omitted if it may make the subject matter of the present disclosure rather unclear.

In the accompanying drawings, the same or corresponding components are assigned the same reference numerals. In addition, in the following description of various examples, duplicate descriptions of the same or corresponding components may be omitted. However, even if descriptions of components are omitted, it is not intended that such components are not included in any example.

Advantages and features of the disclosed examples and methods of accomplishing the same will be apparent by referring to examples described below in connection with the accompanying drawings. However, the present disclosure is not limited to the examples disclosed below, and may be implemented in various forms different from each other, and the examples are merely provided to make the present disclosure complete, and to fully disclose the scope of the disclosure to those skilled in the art to which the present disclosure pertains.

The terms used herein will be briefly described prior to describing the disclosed example(s) in detail. The terms used herein have been selected as general terms which are widely used at present in consideration of the functions of the present disclosure, and this may be altered according to the intent of an operator skilled in the art, related practice, or introduction of new technology. In addition, in specific cases, certain terms may be arbitrarily selected by the applicant, and the meaning of the terms will be described in detail in a corresponding description of the example(s). Therefore, the terms used in the present disclosure should be defined based on the meaning of the terms and the overall content of the present disclosure rather than a simple name of each of the terms.

As used herein, the singular forms "a," "an," and "the" are intended to include the plural forms as well, unless the context clearly indicates the singular forms. Further, the plural forms are intended to include the singular forms as well, unless the context clearly indicates the plural forms. Further, throughout the description, when a portion is stated as "comprising (including)" a component, it is intended as meaning that the portion may additionally comprise (or include or have) another component, rather than excluding the same, unless specified to the contrary.

Further, the term "module" or "unit" used herein refers to a software or hardware component, and "module" or "unit" performs certain roles. However, the meaning of the "module" or "unit" is not limited to software or hardware. The "module" or "unit" may be configured to be in an addressable storage medium or configured to play one or more processors. Accordingly, as an example, the "module" or "unit" may include components such as software components, object-oriented software components, class components, and task components, and at least one of processes, functions, attributes, procedures, subroutines, program code segments, drivers, firmware, micro-codes, circuits, data, database, data structures, tables, arrays, and variables. Furthermore, functions provided in the components and the "modules" or "units" may be combined into a smaller number of components and "modules" or "units", or further divided into additional components and "modules" or "units."

A "module" or "unit" may be implemented as a processor and a memory, or may be implemented as a circuit (circuitry). Terms such as "circuit (circuitry)" may refer to a circuit in hardware, but may also refer to a circuit in software. The "processor" should be interpreted broadly to encompass a general-purpose processor, a Central Processing Unit (CPU), a microprocessor, a Digital Signal Processor (DSP), a controller, a microcontroller, a state machine, and so forth. The "processor" may refer to a combination for processing devices, e.g., a combination of a DSP and a microprocessor, a combination of a plurality of microprocessors, a combination of one or more microprocessors in conjunction with a DSP core, or any other combination of such configurations. In addition, the "memory" should be interpreted broadly to encompass any electronic component that is capable of storing electronic information. The "memory" may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, and so on. The memory is said to be in electronic communication with a processor if the processor can read information from and/or write information to the memory. The memory integrated with the processor is in electronic communication with the processor.

In this disclosure, a "system" may refer to one device including a plurality of FPGAs.

In addition, terms such as first, second, A, B, (a), (b), etc. used in the following examples are only used to distinguish certain components from other components, and the nature, sequence, order, etc. of the components are not limited by the terms.

In addition, in the following examples, if a certain component is stated as being "connected," "combined" or "coupled" to another component, it is to be understood that there may be yet another intervening component "connected," "combined" or "coupled" between the two components, although the two components may also be directly connected or coupled to each other.

In addition, as used in the following examples, "comprise" and/or "comprising" does not foreclose the presence or addition of one or more other elements, steps, operations, and/or devices in addition to the recited elements, steps, operations, or devices.

In the present disclosure, "each of a plurality of A" may refer to each of all components included in the plurality of A, or may refer to each of some of the components included in a plurality of A.

In the present disclosure, "data" may refer to a data item, the data item may refer to data, and the data and the data items are interchangeable.

In the present disclosure, "clock" may be abbreviated as clk.

In the present disclosure, "transfer time" may refer to the time during which data is transferred, or may refer to the time during which data transfer or propagation is delayed.

Likewise, "transmission time" may refer to the time during which data is sent or the time during which data transmission is delayed, and "reception time" may refer to the time during which data is received or the time during which data reception is delayed.

Hereinafter, various examples of the present disclosure will be described in detail with reference to the accompanying drawings.

Figure 1:
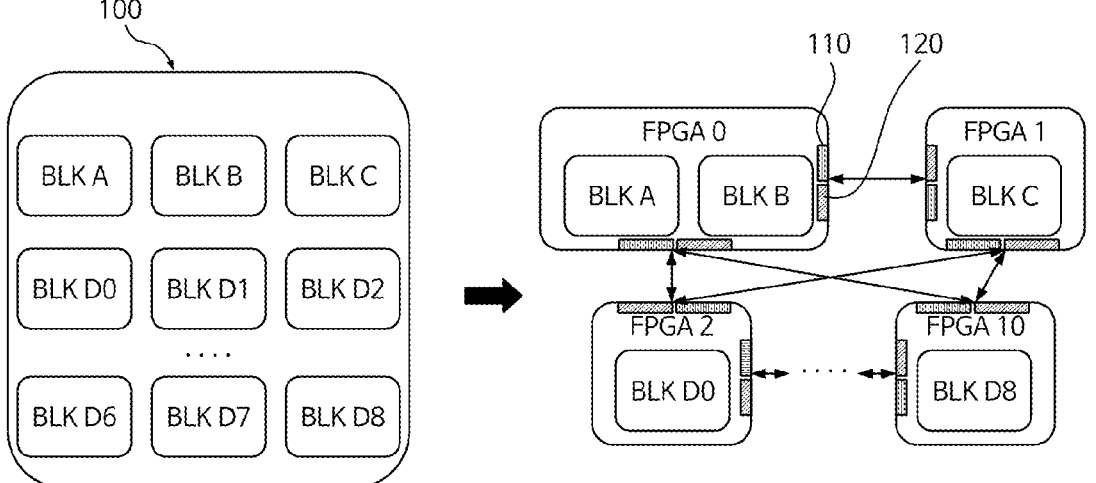
FIG. 1 illustrates an FPGA system including a main FPGA and sub-FPGAs.

FIG. 1 illustrates an FPGA system including a main FPGA (FPGA 0) and sub-FPGAs (FPGA 1 to FPGA 10). A chip 100 may illustrate a target chip design for a specific purpose or any processor that includes such chip designs. Each block (BLK A, BLK B, etc.) included in the chip 100 may be a logic block including basic processing elements such as flip-flops. The chip 100 may be designed as various types of chips. For example, the chip 100 may be designed as a Field Programmable Gate Arrays (FPGA).

However, if the scale of the design or logic to be implemented with the chip 100 exceeds a certain scale, it may be difficult to implement the chip 100 with a single FPGA. Therefore, instead of implementing the design or logic with one chip 100, all target chip designs may be implemented by implementing a plurality of FPGAs each including part of all blocks to be included in the chip 100.

At this time, the plurality of FPGAs (FPGA 0 to 10) may include a main FPGA (FPGA 0) and one or more sub-FPGAs (FPGAs 1 to 10) connected to the main FPGA (FPGA 0), and each of the plurality of FPGAs may communicate with each other using a receiver 110 and a transmitter 120.

At this time, in order to implement, with the plurality of FPGAs, the same functionality as that provided by using one chip 100, it is necessary to transmit and receive data across the plurality of FPGAs based on one clock. For example, if a reference user clock is generated in the main FPGA (FPGA 0) and data communication is performed between a plurality of FPGAs based on this, the same functionality as that provided when using one chip 100, that is, using one FPGA, may be implemented.

Additionally, if multiple clock domains are used in hardware, the FPGA system may include the same number of main FPGAs as the clock domains. That is, one main FPGA and one or more sub-FPGAs may form one subsystem, and the FPGA system may include a plurality of subsystems.

The architecture of the plurality of FPGAs and specific data transmission and reception processes using the plurality of FPGAs will be described in detail below with reference to FIGS. 2 and 3.

Figure 2:
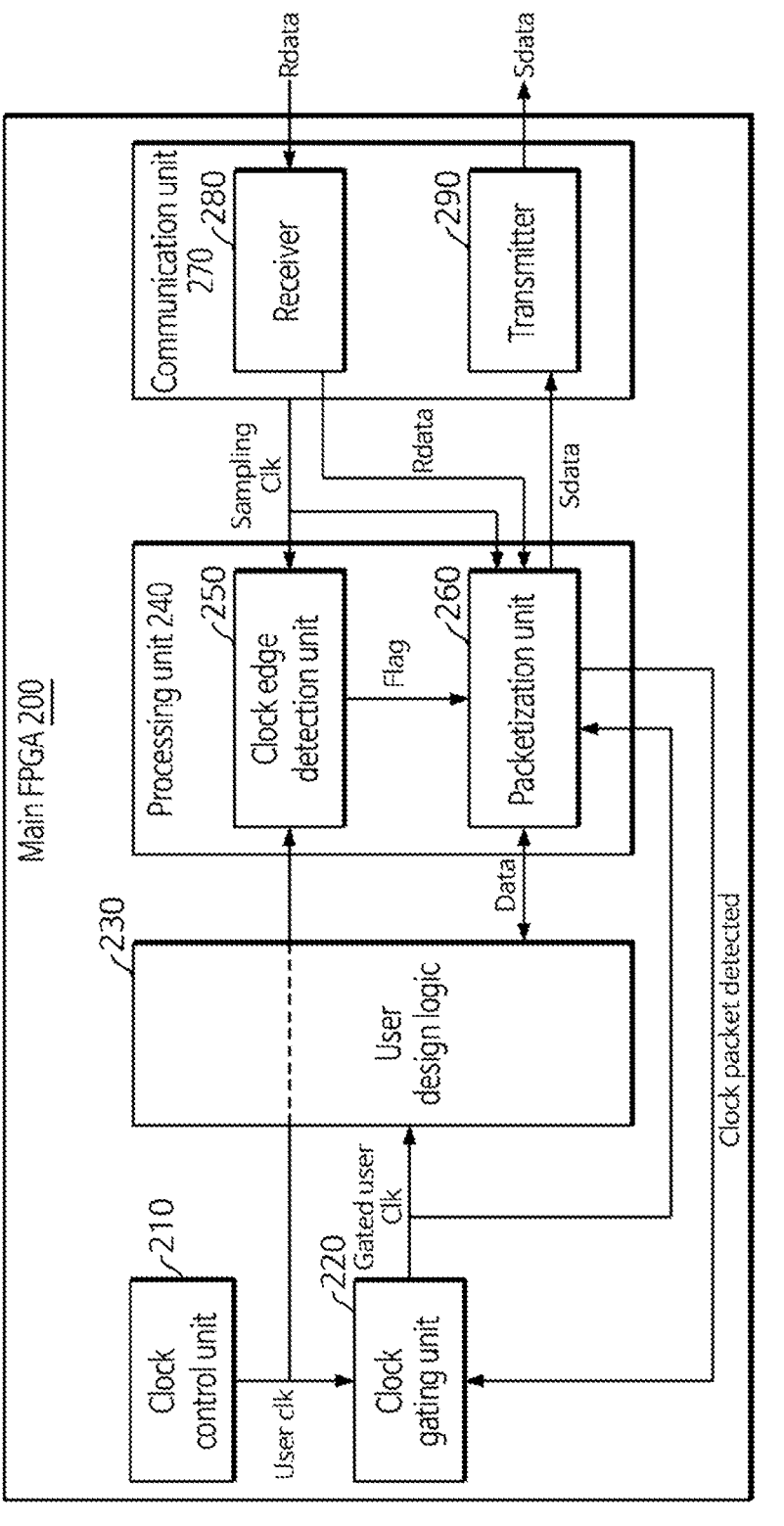
FIG. 2 illustrates an architecture of the main FPGA.

FIG. 2 illustrates an architecture of a main FPGA 200. The main FPGA 200 may include a clock control unit 210 that generates a user clock (User Clk), a clock gating unit 220 that generates a gated user clock (e.g., Gated User Clk) based on the received clock packet, a user design logic 230 in which at least part of the overall logic desired by the user is implemented, a processing unit 240, and a communication unit 270.

The clock control unit 210 may generate a user clock and transfer the generated user clock to each of a clock edge detection unit 250 of the processing unit 240 and the user design logic 230. The clock control unit 210 may be configured to receive an internal clock of the main FPGA and adjust the speed of the internal clock of the main FPGA. For example, the clock control unit 210 may include a phase-locked loop (PLL) that increases the speed of the internal clock of the main FPGA and generates a user clock at one of a plurality of frequencies. The PLL may be implemented with any PLL Intellectual Property (IP) widely known in the FPGA field. The frequency or cycle of this user clock may be determined in advance, which will be described in detail below with reference to Equation 2 in FIG. 8. In another example, the clock control unit 210 may not be implemented in the main FPGA and the internal clock of the main FPGA may be directly used as the user clock. That is, the internal clock of the main FPGA may be directly provided to the clock gating unit 220.

The processing unit 240 may include the clock edge detection unit 250 and a packetization unit 260 that generates clock packets and/or data packets. Each of the clock edge detection unit 250 and the packetization unit 260 may receive a sampling clock (Sampling Clk) of the main FPGA 200. While it is illustrated that this sampling clock is transferred from the communication unit 270 to the clock edge detection unit 250 and the packetization unit 260, aspects are not limited thereto, and the sampling clock may be generated from any unit within the illustrated FPGA or from a separate device and sent to the clock edge detection unit 250 and the packetization unit 260. If the sampling clock is provided from the communication unit 270, information or signals exchanged between the communication unit 270 and the packetization unit 260 may be controlled by the sampling clock.

The clock edge detection unit 250 may detect a positive edge of the pulse included in the user clock provided from the clock control unit 210 using the received sampling clock, and generate a flag (FLAG) associated with the same. That is, the flag may include information associated with the pulse cycle of the user clock. In this case, the sampling clock may include pulses that repeat at a faster cycle than the pulses included in the user clock in order to detect the positive edge of the user clock. The method for detecting the positive edge will be described in detail below using FIG. 4.

The packetization unit 260 may receive the flag from the clock edge detection unit 250 and generate a clock packet (Clock Packet) indicating or characterizing the flag. Examples of such clock packet are described in detail below with reference to FIG. 6. The clock packet generated as described above may be transferred to the sub-FPGA (or to the receiver of the sub-FPGA) through a transmitter 290.

In addition, the generated clock packet may be transferred to a receiver 280 of the main FPGA through the transmitter 290 of the main FPGA. In this case, the transmitter 290 and the receiver 280 of the main FPGA may be connected directly or connected through any circuit (not illustrated). Under this configuration, the main FPGA may receive the generated clock packet by performing loopback on the generated clock packet. The clock packet transferred to the main FPGA through loopback as described above may be transferred to the packetization unit 260.

The packetization unit 260 may detect the transferred clock packet and transfer the detected clock packet or information on the detection of the clock packet to the clock gating unit 220. Under this configuration, the main FPGA processes the data based on the clock packet received through loopback, and the sub-FPGA processes the data based on the clock packet received from the main FPGA, so that the clocks used in each FPGA are the same as each other or take substantially the same packetization time and transfer delay time, thereby minimizing or eliminating a delay between the time of start of data processing in the main FPGA 200 and the time of start of data processing in the sub-FPGA.

The clock gating unit 220 may generate a gated user clock for the main FPGA based on the received clock packet and transfer the generated clock to each of the user design logic 230 and the packetization unit 260. The clock gating unit 220 may be any module or unit that can, after the clock packet is received, control (e.g., gate) the user clock received from the clock control unit 210, and provide the gated user clock to each of the user design logic 230 and the packetization unit 260. For example, the clock gating unit 220 may include any clock gating primitive cell widely used in the FPGA field. The information or signals exchanged between the user design logic 230 and the packetization unit 260 may be controlled by the gated user clock.

The user design logic 230 may generate a plurality of data items through at least some of the logics included in the user design logic 230 based on the gated user clock, and transfer the generated plurality of data items to the packetization unit 260. For example, the user design logic 230 may correspond to one or more of any blocks (BLK A, BLK B, BLK C, BLK DO, BLK D1, BLK D2, . . . , BLK D8) illustrated in FIG. 1.

The packetization unit 260 may receive a sampling clock from a communication unit 370 and generate one or more data packets including a plurality of data items provided from the user design logic 230. For example, one or more data packets generated as described above may be provided to the sub-FPGA through the transmitter 290 of the communication unit 270 using the sampling clock. At this time, the number of one or more data packets may be determined based on the size of the plurality of data items provided from the packetization unit 260 (e.g., data bit width, etc.) and the size of the data included in one data packet. For example, the number of one or more data packets may be determined by Equation 1 below.

$$\left[\left(\frac{W_{TOT_{DATA}}}{W_{DATA}}\right)\right] \qquad < \text{Equation 1} >$$

That is, the number of one or more data packets may be the number of data packets calculated by dividing the size ($W_{TOT_{DATA}}$)) of all data items by the data size ($W_{DATA}$) included in one data packet and rounding up. For example, if the size of the total data item is 6500 bits and the size of data included in one data packet through the communication unit is 800 bits, the number of data packets is determined to be 9, and the entire data items may be divided and generated into 9 packets by a packetization unit 360. The packets generated as described above may be provided to another FPGA (e.g., sub-FPGA, etc.) using the sampling clock of the communication unit 270.

In another example, if a plurality of groups (not illustrated) including the main FPGA and one or more sub-FPGAs are included in the FPGA system, one or more of the generated data packets may be provided to the main FPGA of another group. The main FPGA and one or more sub-FPGAs included in each group may be controlled by the user clock provided by the corresponding main FPGA.

The communication unit 270 may send and receive data (Rdata, Sdata) to and from the sub-FPGA (or the communication unit of the sub-FPGA). Rdata may refer to received data, and Sdata may refer to sent data. On the other hand, if the FPGA system includes a plurality of groups including the main FPGA and one or more sub-FPGAs, the communication unit 270 may be configured to communicate with the main FPGA of another group.

The communication unit 270 may send and receive data (e.g., packets) to and from another FPGA in the FPGA system using the so-called serial communication protocol which continuously sends data one bit at a time using a communication channel or bus. For example, the communication unit 270 may use any serial communication protocol Intellectual Property (IP) used in the chip field, for example, Chip-to-Chip (C2D), Die-to-Die (D2D), Ethernet, Peripheral Component Interconnect express (PCIe) IP, etc., but aspects are not limited thereto.

Figure 3:
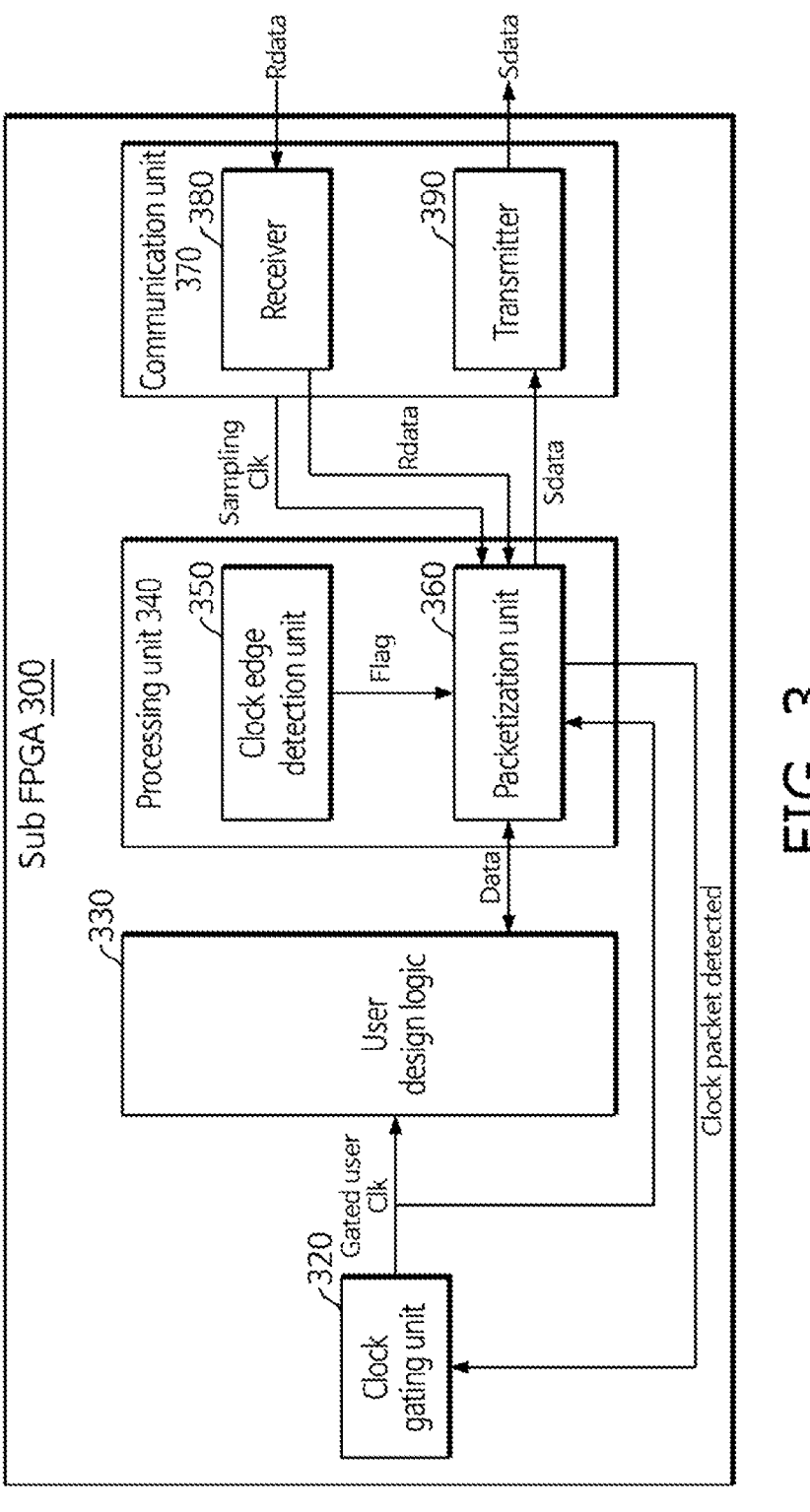
FIG. 3 illustrates an architecture of the sub-FPGA.

FIG. 3 illustrates an architecture of a sub-FPGA 300. The sub-FPGA 300 illustrated in FIG. 3 may include a clock gating unit 320, a user design logic 330, a processing unit 340, and the communication unit 370. The processing unit 340 may include a clock edge detection unit 350 and the packetization unit 360, and the communication unit 370 may include a receiver 380 and a transmitter 390. The clock gating unit 320, the user design logic 330, the processing unit 340, the clock edge detection unit 350, the packetization unit 360, the communication unit 370, the receiver 380, and the transmitter 390 of the sub-FPGA 300 may correspond to the clock gating unit 220, the user design logic 230, the processing unit 240, the clock edge detection unit 250, the packetization unit 260, the communication unit 270, the receiver 280, and the transmitter 290 of the main FPGA 200 of FIG. 2, and the same configuration as at least part of the configuration provided by each part of the main FPGA 200 of FIG. 2 may be provided. In the configurations provided by each part of the sub-FPGA 300 in FIG. 3, the description of the configurations that overlap with the configurations provided by each part of the main FPGA 200 is omitted.

The user design logic 330 may implement at least part of the overall logic that the user intends to implement, and may include a logic different from the user design logic 230 of the main FPGA 200. For example, the user design logic 330 may correspond to one or more of any blocks (BLK A, BLK B, BLK C, BLK DO, BLK D1, BLK D2, . . . , BLK D8) illustrated in FIG. 1, and at least some of the blocks not implemented in the main FPGA 200 of FIG. 2 may be implemented. That is, some of the logics implemented in the entire chip or chip design (e.g., the chip 100 in FIG. 1) may be implemented in the user design logic 330.

The receiver 380 of the communication unit 370 may receive one or more packets from the main FPGA.

The receiver 380 may receive a clock packet from the main FPGA. The sampling clock may be transferred to the packetization unit 360, and the packetization unit 360 may provide a clock packet detected using the sampling clock, or information on the detection of the clock packet to the clock gating unit 320. The clock gating unit 320 may generate a gated user clock and provide the generated clock to the user design logic 330. The data packet of the packets received from the main FPGA may be transferred to the user design logic 330 through the packetization unit 360 and processed using the gated user clock.

In another example, the receiver 380 may receive one or more data packets from the main FPGA. The packetization unit 360 may receive the gated user clock generated by the clock gating unit 320. The packetization unit 360 may provide one or more received data packets to the user design logic 330 using the gated user clock. In addition, the packetization unit 360 may receive a plurality of data items that are processed and output by the user design logic 330.

In addition, the packetization unit 360 may receive a sampling clock from the communication unit 370 and generate one or more data packets including a plurality of received data items. One or more data packets generated as described above may be provided to another FPGA (e.g., the main FPGA 200) through the transmitter 390 using the sampling clock.

FIG. 3 illustrates the sub-FPGA 300 which, unlike the main FPGA, does not include the clock control unit 210. That is, the sub-FPGA 300 may not generate a user clock using its internal clock, in which case the user clock gated by the clock gating unit 320 may be generated upon receiving the clock packet detected by the packetization unit 360 or the information on the detection of the clock packet. At this time, the cycle of the detected clock packets and the cycle of the gated user clock may be the same or similar to each other.

In addition, while FIG. 3 illustrates that the clock edge detection unit 350 is included in the processing unit 340, because the sub-FPGA 300 does not generate or control the user clock using the internal clock, the clock edge detection unit 350 may not perform any function. Under this configuration, the clock edge detection unit 350 may be processed as 0. Accordingly, instead of implementing an architecture different from that of the main FPGA 200, the sub-FPGA 300 may be implemented by omitting the clock control unit 210 of the main FPGA 200, for example, by omitting the PLL IP. At this time, the internal clock of the sub-FPGA 300 may be deactivated. Conversely, the clock edge detection unit 350 may not be included in the processing unit 340.

The internal configuration of the main FPGA 200 and the sub-FPGA 300 illustrated in FIGS. 2 and 3 are merely examples, and in some examples, configurations other than the internal configuration illustrated herein may be additionally included, and some configurations may be omitted. In addition, although the internal configurations of the main FPGA 200 and the sub-FPGA 300 are separated by function and described in FIGS. 2 and 3, this does not necessarily mean that they are physically separated. Although the internal configurations of the main FPGA 200 and the sub-FPGA 300 are separately described above, this is to aid understanding of the disclosure, and aspects are not limited thereto.

Figure 4:
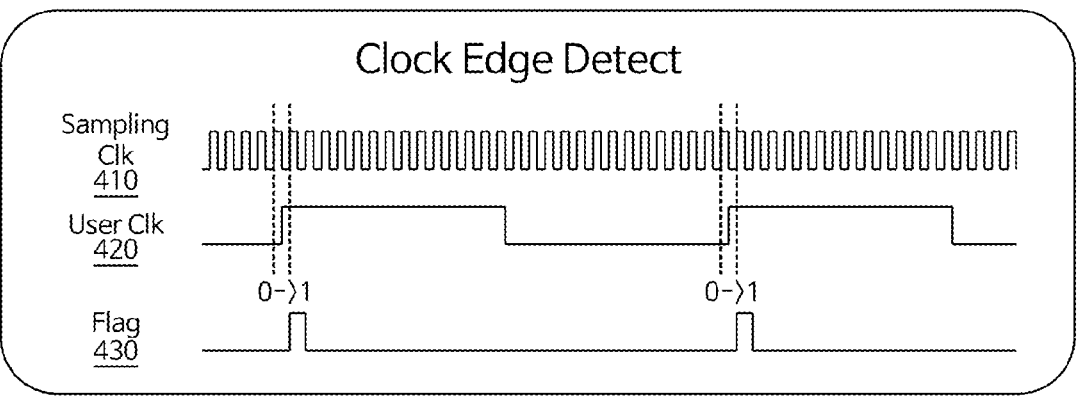
FIG. 4 illustrates an example in which a positive edge of a user clock is detected using a sampling clock.

FIG. 4 illustrates an example in which the positive edge of a user clock 420 is detected using a sampling clock 410. The sampling clock 410 may include pulses that repeat 0 and 1 at regular intervals. At this time, the pulse included in the sampling clock 410 may be repeated at a faster cycle than the pulse included in the user clock 420. For example, unlike the example illustrated in FIG. 4, the pulses included in the sampling clock 410 may repeat at a much faster cycle (e.g., at a cycle about 10 to 100 times faster) than the pulses included in the user clock 420.

The sampling clock 410 may correspond to the sampling clock (Sampling Clk) provided by the main FPGA of FIG. 2. As described in FIG. 2, for example, a sampling clock (Sampling Clk) may be generated in the communication unit 270 and provided to the clock edge detection unit 250 and the packetization unit 260 of the processing unit 240.

The positive edge of the user clock 420 may be detected according to the product of the pulse of the sampling clock 410 and the pulse of the user clock 420. For example, as illustrated, the time point at which the product of the pulse of the sampling clock 410 and the pulse of the user clock 420 is 1 rather than 0 may be determined to be the time point at which the positive edge of the user clock 420 occurs. Accordingly, if the cycle of the sampling clock 410 is shortened, the difference between the time when the positive edge of the user clock 420 actually occurs and the time when it is detected may decrease. As described in FIG. 2, the positive edge of the user clock 420 may be detected by the clock edge detection unit 250 of the processing unit 240.

In response to detecting the positive edge, a flag 430 may be generated. That is, since the flag 430 includes information associated with a plurality of time points of detecting the positive edge, the cycle information of the user clock 420 may be acquired from the flag 430. The information associated with the flag 430 may be included in the clock packet and sent to the sub-FPGA.

In addition, as illustrated, the width of high level of one pulse included in the flag 430 may correspond to the width of one entire pulse (including the high level and low level) included in the sampling clock.

Figure 5:
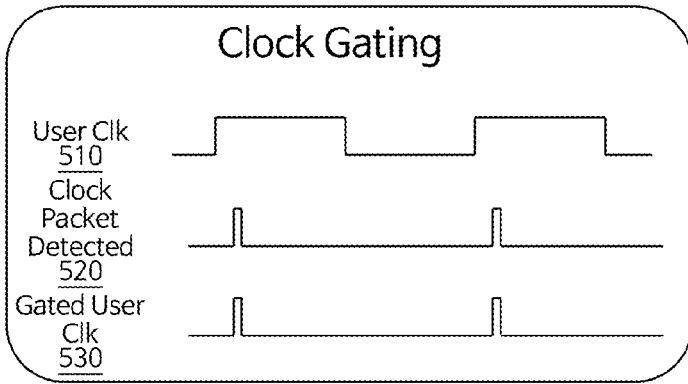
FIG. 5 illustrates an example of a gated user clock and a clock packet generated in response to detecting a user clock.

FIG. 5 illustrates an example of a clock packet 520 and a gated user clock 530 generated in response to detecting a user clock 510. A clock packet may be generated that includes information indicating a flag generated in response to detecting the user clock 510. As described in FIG. 2, this clock packet may be generated by the packetization unit 260 of the processing unit 240. The clock packet generated as described above may be provided from the main FPGA 200 to one of one or more sub-FPGAs (e.g., the sub-FPGA 300, etc.). In addition, through loopback, the clock packet may be provided to the packetization unit 260 of the main FPGA through the communication unit of the main FPGA.

If the clock packet is received or detected in the packetization unit of one or more sub-FPGAs and/or the packetization unit of the main FPGA, a detected clock packet 520 may be generated. As illustrated, the detected clock packet 520 may be configured such that a pulse is generated when the clock packet is received or detected.

The detected clock packet 520 may be provided to the clock gating unit of the corresponding FPGA, and the clock gating unit may generate a gated user clock (Gated User Clk) for the corresponding FPGA. The gated user clock generated as described above may be provided to the user design logic and the packetization unit of the corresponding FPGA, respectively.

Since the gated user clock is generated as soon as the detected clock packet 520 is provided to the clock gating unit, as illustrated in FIG. 5, the time point of start of the positive edge of the pulse of the detected clock packet 520 may be the same as the time point of start of the positive edge of the gated user clock. Conversely, the positive edge of the pulse of the gated user clock may be slightly later than the time point of start of the positive edge of the pulse of the detected clock packet 520. Under this configuration, the repetition cycle of the pulse of the gated user clock may be the same as the repetition cycle of the pulse of the detected clock packet 520.

The pulse width of the gated user clock may be the same as the pulse width of the clock packet 520. According to another example, the pulse width of the gated user clock may be different from the pulse width of the clock packet 520.

Figure 6:
FIG. 6 illustrates an example of a packet.

FIG. 6 illustrates an example of a packet 600. As described above in FIGS. 2 and 3, packets may be generated by each of the packetization unit 260 of the main FPGA 200 and the packetization unit 360 of the sub-FPGA (e.g., the sub-FPGA 300). The packetization unit 260 of the main FPGA 200 may generate the clock packets and the data packets, and the packetization unit 360 of the sub-FPGA may generate only the data packets.

The packet 600 illustrated in FIG. 6 may be an example of a format in which the clock packet and the data packet may be generated. For example, the packet 600 may be formed in a format that includes an operation mode bit (OP) area 610 indicating an operation mode, a counter bit (CNT) area 620 that is a set of bits indicating a packet number, and data bit (Data) area 630 that is a set of bits representing at least some of a plurality of data items. A specific example of generating a plurality of data packets including the clock packet and the data packet will be described in detail below with reference to FIG. 7.

Figure 7:
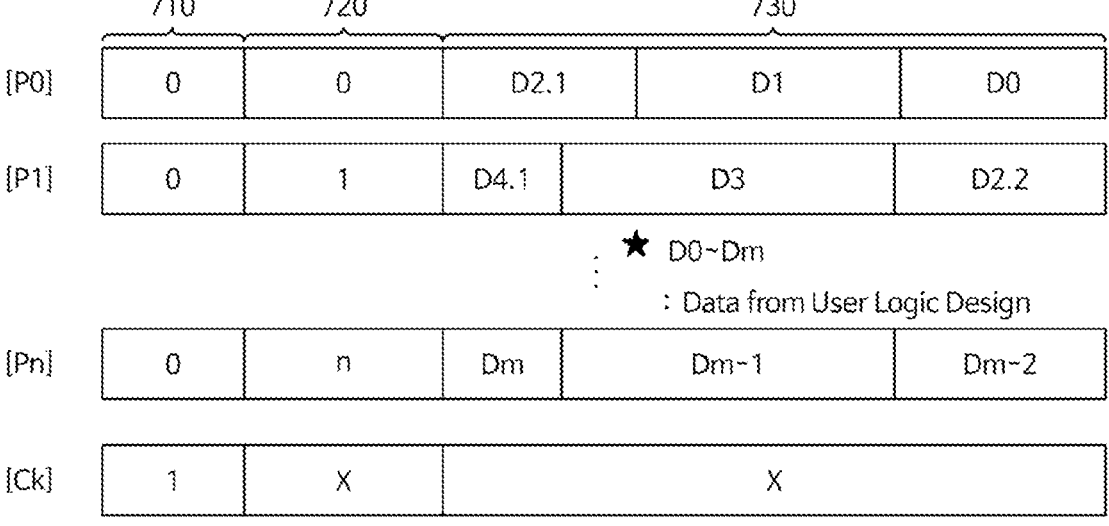
FIG. 7 illustrates an example of a plurality of packets transferred to an FPGA.

FIG. 7 illustrates an example of a plurality of packets transferred to the FPGA. The plurality of packets may be provided from one FPGA to another FPGA. For example, a plurality of packets generated in the main FPGA may be provided to the sub-FPGA, and a plurality of packets generated in the sub-FPGA may be provided to the main FPGA.

The plurality of packets may include the data packets and the clock packets. For example, as illustrated in FIG. 7, the plurality of packets may include a plurality of data packets including [P0] to [Pn] (where, n is a natural number) and a clock packet including [Ck].

In FIG. 7, an OP area 710 of the packet may indicate the operation mode of the packet, a CNT area 720 of the packet may indicate the packet number, and a Data area 730 of the packet may represent at least some of a plurality of data items of the packet.

Each of the plurality of data packets ([P0] to [Pn]) may include one bit indicating a mode for sending data to the OP area 710. For example, the OP area 710 may include "0" as a data transmission mode. In addition, for the data packet, the CNT area 620 may include a set of bits indicating the data packet number, and the Data area 630 may include a set of bits indicating information on one or more data items. As illustrated in FIG. 7, the data packets ([P0] to [Pn]) may include information indicating the packet numbers in the CNT area in the order in which the data packets ([P0] to [Pn]) are arranged. In addition, each of the data packets ([P0] to [Pn]) may include at least some of a plurality of data items. For example, as shown in the data packet [P0], one data item may be completely included as in the case of D0 and D1, or one item may be divided and stored as in the case of D2.1.

For the clock packet [Ck], the OP area 710 may include a flag or one bit indicating information on the detection of the clock edge. For example, in the clock packet, the OP area 710 may include "1" as a clock edge mode. In addition, in the clock packet [Ck], a set of bits included in each of the CNT area 720 and the Data area 730 may be empty or set to 0. For illustrative purposes, in FIG. 7, the CNT area 720 and the Data area 730 of the clock packet [Ck] are marked "X", but the mark "X" may mean that the set of bits included in each of the CNT area 720 and the Data area 730 is empty or set to 0. That is, the CNT area 720 and the Data area 730 may be used only for packets including data items. Additionally, if there are multiple clocks, the CNT area 720 and/or the Data area 730 may be used to further indicate which of the multiple clocks represents an edge.

The FPGA (e.g., the packetization unit of the FPGA) receiving the packet may remap the data of the received packet based on the packet number indicated by the set of bits in the CNT area 720 if the bit in the OP area 710 included in the packet indicates "0". Conversely, if the bit in the OP area 710 is 1, a gated user clock for the corresponding FPGA may be generated based on the sampling clock of the receiving FPGA.

In FIG. 7, the clock packet [Ck] is placed below the plurality of data packets, so it may be understood that a plurality of data packets are generated and then the clock packet is generated, but aspects are not limited thereto, and the clock packet [Ck] may be placed in the middle of or above the plurality of data packets. That is, the clock packet may be generated in the middle of or before a plurality of data packets.

FIG. 8 illustrates an example of a timing diagram in which a packet is transferred. As shown in FIG. 8, information on the cycle of the user clock of the main FPGA may be obtained from a flag generated using a sampling clock (Sampling Clk).

In the multiple FPGA system including a plurality of FPGAs, in order to provide the same functionality as that provided by one FPGA, all data packets generated from the main FPGA must be transferred to any one of one or more sub-FPGAs during one cycle of the user clock of the main FPGA. In addition, all data packets generated in the sub-FPGA must be transferred to the main FPGA during one cycle of the user clock of the main FPGA. To this end, the main FPGA generates a clock packet every time a flag is generated and transfers the generated clock to another FPGA (e.g., sub-FPGA) or receives a generated clock from another FPGA, so that all data packets that need to be processed or transferred in one cycle of the user clock may be transferred to or received from the sub-FPGA before the next clock packet is generated and sent.

Under this configuration, the frequency of the user clock may be predetermined based on a frequency of the sampling clock of the main FPGA (and/or sub-FPGA), a number of the one or more data packets, and data transfer time between any two FPGAs of the main FPGA and the one or more sub-FPGAs. At this time, the frequencies of the sampling clock of the main FPGA and sampling clock of the sub-FPGA may be the same as each other. The sampling clock of the main FPGA and the sampling clock of the sub-FPGA may be synchronized with each other. According to another example, the sampling clock of the main FPGA and the sampling clock of the sub-FPGA may be asynchronized with each other. In addition, as described above, since the main FPGA sends and receives the clock packets through the loopback function, the clock data transfer time may include the time for transferring data from the main FPGA to the main FPGA.

The cycle of the user clock may be equal to or greater than the resultant number obtained by adding the product of multiplying the cycle of the sampling clock of the main FPGA by the resultant number obtained by adding the number of the clock packets and the number of the one or more data packets, and the data transmission delay and reception delay between any two FPGAs of the main FPGA and the one or more sub-FPGAs. That is, the cycle of the user clock may have the magnitude relationship of Equation 2 below.

$$\frac{1}{FREQ_{user_{clk}}} \geq$$  < Equation 2 >

$$\frac{1}{FREQ_{Sampling_{clk}}}\left(\left[\left(\frac{W_{TOT_{DATA}}}{W_{DATA}}\right)\right] + 1\right) + (2 \times T_{prop}) + T_{margin}$$

where, $$\frac{1}{FREQ_{user_{clk}}}$$

may represent the cycle of the user clock of the main FPGA, $$\frac{1}{FREQ_{Sampling_{clk}}}$$

may represent the cycle of the sampling clock 410 of the main FPGA or sub-FPGA, and $$\left[\left(\frac{W_{TOT_{DATA}}}{W_{DATA}}\right)\right] + 1$$

may represent the resultant number obtained by adding the number (that is, 1) of clock packets to the number of one or more data packets generated to include a plurality of data items received from the user design logic. As explained in Equation 1 above, $$\left[\left(\frac{W_{TOT_{DATA}}}{W_{DATA}}\right)\right]$$

may represent the number of data packets calculated by dividing the total data size ($W_{TOT_{DATA}}$) of a plurality of data items by the data size ($W_{DATA}$) included in one data packet and rounding up. The data size may be defined as bit width. In addition, ($2 \times T_{prop}$) may be the sum of the transmission time (e.g., transmission delay time) and reception time (e.g., reception delay time) between any two FPGAs, and $T_{margin}$ may be a margin time. For example, information on the processing speed of multiple data items in the user design logic (for example, information on the processing speed of multiple data items may be defined by sampling clock frequency information, total data size, data bit width, etc.), information on the frequency of the sampling clock, and information on the transmission and reception time (or, transmission and reception delay time) between FPGAs may be acquired in advance through the specifications of Serial IP. Accordingly, an amount to increase or adjust the frequency or speed of the internal clock of the main FPGA provided by the clock control unit (e.g., PLL IP) of the FPGA to satisfy Equation 2 above using the acquired information may be set in advance. That is, the output frequency may be determined in advance by adjusting the frequency of the internal clock of the main FPGA by the clock control unit of the main FPGA. This predetermined frequency may correspond to any one of various frequencies provided from PPL IP.

In addition, the bandwidth (BW) that may be sent at one time through the communication unit may be determined by Equation 3 below.

$$BW = FREQ_{sampling\_clk} \times (W_{OP} + W_{CNT} + W_{DATA})$$  < Equation 3 > where, $FREQ_{sampling\_clk}$ may refer to the frequency (clock frequency) of the sampling clock provided by the communication unit, and $W_{OP} + W_{CNT} + W_{DATA}$ may refer to the size of the packet (bit width of the packet) including the OP area, the CNT area, and the Data area described above in FIGS. 6 and 7. For example, as illustrated in FIG. 8, one packet of R/S data may be transferred per sampling clock cycle.

FIG. 9 illustrates pulses of the clock signals associated with the main FPGA and sub-FPGAs. The positive edge included in the user clock of FPGA 0 (User Clk of FPGA 0; 910) may be detected using the sampling clock of FPGA 0 (Sampling Clk of FPGA 0; 920). FPGA 0 may correspond to the main FPGA 200 of FIG. 2. A clock packet (Clk Pkt (sd); 930) may be generated using the detected positive edge. For example, the clock packet 930 may be generated by the packetization unit of FPGA 0.

The clock packet 930 generated as described above may be transferred back to the receiver of FPGA 0 through the transmitter of FPGA 0 through the loopback function. The clock packet transferred to the receiver of FPGA 0 may be a loopback clock packet (LB Clk Pkt (rc) of FPGA 0; 940) that is delayed from the clock packet (Clk Pkt (sd); 930) at the time of generation due to propagation delay that occurs when the signal is transferred. Based on this, a gated user clock for FPGA 0 (Gated User Clk of FPGA 0; 950) may be generated in the clock gating unit of FPGA 0. For example, as illustrated in FIG. 9, the width of high level of one pulse included in the loopback clock packet 940 may correspond to the width of one entire pulse (including the high level and low level) included in the sampling clock 920 of FPGA 0. Additionally, the width of high level of the pulse included in the gated user clock 950 may correspond to the width of high level of one pulse included in the delayed loopback clock packet 940.

In addition, the generated clock packet 930 may also be transferred to FPGA 1. FPGA 1 may correspond to the sub-FPGA 300 in FIG. 3. In this case, the clock packet 960 is sensed/detected using the sampling clock 970, and a gated user clock (Gated User Clk of FPGA 1; 980) may be generated based on the clock packet 960 and applied to FPGA 1. For example, as illustrated in FIG. 9, the width of high level of one pulse included in the clock packet 960 may correspond to the width of one entire pulse (including the high level and low level) included in the sampling clock 970 of FPGA 1. In addition, the width of high level of the pulse included in the gated user clock 980 may correspond to the width of high level of one pulse included in the clock packet 960.

Under this configuration, the clock packet 930 from FPGA 0 (main FPGA) may be transferred to FPAG 1, and also the clock packet may be transferred to the receiver of FPGA 0 through the transmitter of FPGA 0 through the loopback function, thereby minimizing or eliminating the delay between the time of start of data processing in FPGA 0 and the time of start of data processing in FPGA 1.

FIG. 10 is a flowchart illustrating a method 1000 for generating a synchronized clock in a plurality of FPGAs including the main FPGA and one or more sub-FPGAs. The method 1000 illustrated in FIG. 10 is merely one example for achieving the object of the present disclosure, and it goes without saying that certain steps may be added or deleted as needed. In addition, the method 1000 illustrated in FIG. 10 may be performed by a processor of the main FPGA and/or one or more sub-FPGAs.

The method 1000 may be initiated by the main FPGA (e.g., the main FPGA 200) detecting the positive edge of a pulse included in the user clock using the sampling clock of the main FPGA, at S1010. The frequency of the user clock may be predetermined based on the frequency of the sampling clock of the main FPGA, the number of the one or more data packets, and the data transfer time between any two FPGAs of the main FPGA and the one or more sub-FPGAs. For example, the cycle of the user clock may be equal to or greater than the resultant number obtained by adding the product of multiplying the cycle of the sampling clock of the main FPGA by the resultant number obtained by adding the number of the clock packets and the number of the one or more data packets, to the data transmission and reception time between any two FPGAs of the main FPGA and the one or more sub-FPGAs.

The main FPGA may generate a flag using the detected positive edge, at S1020. In addition, the main FPGA may generate a clock packet indicating the generated flag, at S1030. Each of the clock packets may be formed in a format that includes a set of bits representing an operation mode, a set of bits representing a packet number, and a set of bits representing at least some of a plurality of data items. The clock packet may be a packet that includes, as a bit representing the operation mode, a bit representing the generated flag. For example, in the clock packet, a set of bits representing the packet number and the set of bits representing at least some of a plurality of data items may be empty or set to 0.

The processor may provide the generated clock packet to any one of one or more sub-FPGAs, at S1040. If the generated clock packet is provided to any one of one or more sub-FPGAs, a gated user clock may be generated for any one of the one or more sub-FPGAs provided with the clock packet, using a sampling clock of any one of the one or more sub-FPGAs provided with the clock packet.

The main FPGA may include a communication unit including a transmitter and a receiver, and may transmit the generated clock packet through the transmitter of the communication unit and receive the same through the receiver of the communication unit. The main FPGA is configured to generate a gated user clock for the main FPGA based on the received clock packet, generate a plurality of data items using the gated user clock, and generate a data packet including a plurality of data items using a sampling clock of the main FPGA. Each of the data packets, like the clock packet, may be formed in a format that includes a set of bits indicating an operation mode, a set of bits indicating a packet number, and a set of bits indicating at least some of a plurality of data items.

The main FPGA may further include a user design logic and a packetization unit, in which the user design logic may receive the gated user clock, the user design logic may generate a plurality of data items using the gated user clock, the packetization unit may receive the generated plurality of data items, and the packetization unit may generate one or more data packets including the plurality of data items.

The communication unit may be configured to operate according to a serial communication protocol, the main FPGA may be further configured to provide the generated one or more data packets to any one of the one or more sub-FPGAs through the transmitter of the communication unit, and the number of one or more data packets may be determined based on a size of the plurality of data items and a size of data included in one data packet.

The flowchart and description above are merely examples and may be implemented differently in some examples. For example, in some examples, the order of respective steps may be changed, some steps may be repeatedly performed, some steps may be omitted, or some steps may be added.

The method described above may be provided as a computer program stored in a computer-readable recording medium for execution on a computer. The medium may be a type of medium that continuously stores a program executable by a computer, or temporarily stores the program for execution or download. In addition, the medium may be a variety of recording means or storage means having a single piece of hardware or a combination of several pieces of hardware, and is not limited to a medium that is directly connected to any computer system, and accordingly, may be present on a network in a distributed manner. An example of the medium includes a medium configured to store program instructions, including a magnetic medium such as a hard disk, a floppy disk, and a magnetic tape, an optical medium such as a CD-ROM and a DVD, a magnetic-optical medium such as a floptical disk, and a ROM, a RAM, a flash memory, etc. In addition, other examples of the medium may include an app store that distributes applications, a site that supplies or distributes various software, and a recording medium or a storage medium managed by a server.

The methods, operations, or techniques of the present disclosure may be implemented by various means. For example, these techniques may be implemented in hardware, firmware, software, or a combination thereof. Those skilled in the art will further appreciate that various illustrative logical blocks, modules, circuits, and algorithm steps described in connection with the disclosure herein may be implemented in electronic hardware, computer software, or combinations of both. To clearly illustrate this interchangeability of hardware and software, various illustrative components, blocks, modules, circuits, and steps have been described above generally in terms of their functionality. Whether such a function is implemented as hardware or software varies depending on design requirements imposed on the particular application and the overall system. Those skilled in the art may implement the described functions in varying ways for each particular application, but such implementation should not be interpreted as causing a departure from the scope of the present disclosure.

In the implementation using firmware and/or software, the techniques may be implemented with instructions stored on a computer-readable medium, such as random access memory (RAM), read-only memory (ROM), non-volatile random access memory (NVRAM), programmable read-only memory (PROM), erasable programmable read-only memory (EPROM), electrically erasable PROM (EEPROM), flash memory, compact disc (CD), magnetic or optical data storage devices, etc. The instructions may be executable by one or more processors, and may cause the processor(s) to perform certain aspects of the functions described in the present disclosure.

If implemented in software, the techniques described above may be stored on a computer-readable medium as one or more instructions or codes, or may be sent via a computer-readable medium. The computer-readable media include both the computer storage media and the communication media including any medium that facilitates the transmission of a computer program from one place to another. The storage media may also be any available media that may be accessible to a computer. By way of non-limiting example, such a computer-readable medium may include RAM, ROM, EEPROM, CD-ROM or other optical disk storage, magnetic disk storage or other magnetic storage devices, or any other media that can be used to transmit or store desired program code in the form of instructions or data structures and can be accessible to a computer. In addition, any connection is properly referred to as a computer-readable medium.

A software module may reside in RAM, flash memory, ROM memory, EPROM memory, EEPROM memory, registers, hard disk, removable disk, CD-ROM, or any other form of storage medium known. An exemplary storage medium may be connected to the processor, such that the processor may read or write information from or to the storage medium. Alternatively, the storage medium may be integrated into the processor. The processor and the storage medium may exist in the FPGA.

Although the present disclosure has been described in connection with some examples herein, various modifications and changes can be made without departing from the scope of the present disclosure, which can be understood by those skilled in the art to which the present disclosure pertains. In addition, such modifications and changes should be considered within the scope of the claims appended herein.

The invention claimed is:

1. A Field Programmable Gate Array (FPGA) configured to:
   detect a positive edge of a pulse included in a user clock using a sampling clock of the FPGA;
   generate a flag using the detected positive edge;
   generate a clock packet indicating the generated flag; and
   provide the generated clock packet to any one of one or more sub-FPGAs connected to the FPGA.

2. The FPGA according to claim 1, wherein the FPGA includes a communication unit including a transmitter and a receiver, and
   the FPGA is further configured to transmit the generated clock packet through the transmitter of the communication unit and receive the generated clock packet through the receiver of the communication unit.

3. The FPGA according to claim 2, wherein the FPGA is further configured to:
   generate a gated user clock for the FPGA based on the received clock packet;
   generate a plurality of data items using the gated user clock; and
   generate a data packet including the generated plurality of data items.

4. The FPGA according to claim 3, wherein the FPGA further includes a user design logic and a packetization unit,
   the generating the plurality of data items using the gated user clock includes:
   receiving, by the user design logic, the gated user clock; and
   generating, by the user design logic, the plurality of data items using the gated user clock, and
   the generating the data packet including the plurality of data items includes:
   receiving, by the packetization unit, the generated plurality of data items; and
   generating, by the packetization unit, one or more data packets including the plurality of data items.

5. The FPGA according to claim 4, wherein the communication unit is configured to operate according to a serial communication protocol,
   the FPGA is further configured to provide the generated one or more data packets to any one of the one or more sub-FPGAs through the transmitter of the communication unit, and
   a number of the one or more data packets is determined based on a size of the plurality of data items and a size of data included in one data packet.

6. The FPGA according to claim 5, wherein a frequency of the user clock is predetermined based on a frequency of the sampling clock of the FPGA, the number of the one or more data packets, and a data transfer time between any two FPGAs of the FPGA and the one or more sub-FPGAs.

7. The FPGA according to claim 5, wherein a cycle of the user clock is equal to or greater than a resultant number obtained by adding a product of multiplying a cycle of the sampling clock of the FPGA by a number obtained by adding a number of clock packets to the number of the one or more data packets, and data transmission and reception time between any two FPGAs of the FPGA and the one or more sub-FPGAs.

8. The FPGA according to claim 3, wherein each of the clock packet and the data packet is formed in a format that includes a bit representing an operation mode, a set of bits representing a packet number, and a set of bits representing at least some of a plurality of data items.

9. The FPGA according to claim 8, wherein the clock packet has the set of bits representing the packet number and the set of bits representing at least some of the plurality of data items, which are empty or set to 0.

10. The FPGA according to claim 8, wherein the clock packet is a packet that includes, as a bit representing the operation mode, a bit representing the generated flag, and if the clock packet is provided to any one of the one or more sub-FPGAs, a gated user clock is generated for any one of the one or more sub-FPGAs provided with the clock packet, using a sampling clock of any one of the one or more sub-FPGAs provided with the clock packet.

11. A Field Programmable Gate Array (FPGA) configured to:

receive, from a main-FPGA connected to the FPGA, a clock packet indicating a flag,
wherein the flag is generated, using a positive edge of a pulse included in a user clock, and
the positive edge is detected, using a sampling clock of the main-FPGA.

12. The FPGA according to claim 11, wherein the main-FPGA includes a communication unit including a transmitter and a receiver, and the main-FPGA is configured to transmit the clock packet through the transmitter of the communication unit and receive the clock packet through the receiver of the communication unit.

13. The FPGA according to claim 12, wherein the main-FPGA is further configured to:

generate a gated user clock for the main-FPGA based on the clock packet received through the receiver;
generate a plurality of data items using the gated user clock; and
generate a data packet including the generated plurality of data items.

14. The FPGA according to claim 13, wherein the main-FPGA further includes a user design logic and a packetization unit, the generating the plurality of data items using the gated user clock includes:
receiving, by the user design logic, the gated user clock; and generating, by the user design logic, the plurality of data items using the gated user clock, and
the generating the data packet including the plurality of data items includes:
receiving, by the packetization unit, the generated plurality of data items; and
generating, by the packetization unit, one or more data packets including the plurality of data items.

15. The FPGA according to claim 14, wherein the communication unit is configured to operate according to a serial communication protocol, the main-FPGA is further configured to provide the generated one or more data packets to the FPGA through the transmitter of the communication unit, and
a number of the one or more data packets is determined based on a size of the plurality of data items and a size of data included in one data packet.

16. The FPGA according to claim 15, wherein a frequency of the user clock is predetermined based on a frequency of the sampling clock of the main-FPGA, the number of the one or more data packets, and a data transfer time between any two FPGAs of the main-FPGA and one or more sub-FPGAs connected to the main-FPGA, and the FPGA is one of the one or more sub-FPGAs.

17. The FPGA according to claim 15, wherein a cycle of the user clock is equal to or greater than a resultant number obtained by adding a product of multiplying a cycle of the sampling clock of the main-FPGA by a number obtained by adding a number of clock packets to the number of the one or more data packets, and data transmission and reception time between any two FPGAs of the main-FPGA and one or more sub-FPGAs connected to the main-FPGA, and the FPGA is one of the one or more sub-FPGAs.

18. The FPGA according to claim 13, wherein each of the clock packet and the data packet is formed in a format that includes a bit representing an operation mode, a set of bits representing a packet number, and a set of bits representing at least some of a plurality of data items.

19. The FPGA according to claim 18, wherein the clock packet has the set of bits representing the packet number and the set of bits representing at least some of the plurality of data items, which are empty or set to 0.

20. The FPGA according to claim 18, wherein the clock packet is a packet that includes, as a bit representing the operation mode, a bit representing the generated flag, and a gated user clock is generated for the FPGA, using a sampling clock of the FPGA.

\* \* \* \* \*